(12) United States Patent
Oh et al.

(10) Patent No.: US 9,169,988 B2
(45) Date of Patent: Oct. 27, 2015

(54) LIGHT EMITTING MODULE AND HEAD LAMP INCLUDING THE SAME

(75) Inventors: Nam Seok Oh, Seoul (KR); Yun Min Cho, Seoul (KR); Jong Woo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 368 days.

(21) Appl. No.: 13/412,833

(22) Filed: Mar. 6, 2012

(65) Prior Publication Data

US 2013/0033885 A1   Feb. 7, 2013

(30) Foreign Application Priority Data

Aug. 2, 2011  (KR) .................. 10-2011-0077096
Aug. 17, 2011  (KR) .................. 10-2011-0081503

(51) Int. Cl.
| | |
|---|---|
| H01L 33/00 | (2010.01) |
| F21V 3/02 | (2006.01) |
| F21V 9/16 | (2006.01) |
| F21V 3/04 | (2006.01) |
| F21S 8/10 | (2006.01) |
| F21K 99/00 | (2010.01) |
| F21W 131/103 | (2006.01) |
| F21Y 101/02 | (2006.01) |
| F21Y 103/00 | (2006.01) |
| F21V 17/10 | (2006.01) |

(52) U.S. Cl.
CPC .................. *F21V 3/02* (2013.01); *F21S 48/115* (2013.01); *F21S 48/1225* (2013.01); *F21S 48/215* (2013.01); *F21S 48/2218* (2013.01); *F21S 48/31* (2013.01); *F21V 3/0472* (2013.01); *F21V 3/0481* (2013.01); *F21V 9/16* (2013.01); *F21K 9/00* (2013.01); *F21V 3/0463* (2013.01); *F21V 17/101* (2013.01); *F21W 2131/103* (2013.01); *F21Y 2101/02* (2013.01); *F21Y 2103/003* (2013.01)

(58) Field of Classification Search
CPC ................ H01L 33/62; H01L 27/3244; H01L 2933/0033; H01L 2933/0041; F21Y 2101/02; F21Y 2101/025; F21Y 2105/001; F21Y 2111/007; F21Y 2103/003; F21Y 2105/003; F21Y 2105/005; F21Y 2111/005; F21V 29/22; F21V 7/00; F21V 5/04; F21V 23/009
See application file for complete search history.

(56) References Cited

U.S. PATENT DOCUMENTS

| | | | | |
|---|---|---|---|---|
| 2006/0163590 A1* | 7/2006 | Erchak et al. | | 257/88 |
| 2009/0242923 A1* | 10/2009 | Goodrich | | 257/99 |
| 2010/0102344 A1* | 4/2010 | Ueji | | 257/98 |
| 2010/0207142 A1* | 8/2010 | Chen et al. | | 257/98 |
| 2011/0084299 A1* | 4/2011 | Kotani et al. | | 257/98 |
| 2011/0101405 A1* | 5/2011 | Chang et al. | | 257/99 |
| 2011/0127912 A1* | 6/2011 | Lee et al. | | 315/32 |

* cited by examiner

*Primary Examiner* — David Vu
*Assistant Examiner* — Cuong Nguyen
(74) *Attorney, Agent, or Firm* — Birch, Stewart, Kolasch & Birch, LLP

(57) ABSTRACT

Disclosed herein is a light emitting module. The light emitting module according to an exemplary embodiment includes a circuit board which has a cavity and includes a metal board, an insulation layer, and a circuit pattern, an insulation board disposed in the cavity, at least one light emitting device disposed on the insulation board, first and second pads disposed on the insulation board to be electrically connected with the light emitting device, and a conductive pad for electrically connecting the second pad and the circuit pattern.

17 Claims, 11 Drawing Sheets

LIGHT EMITTING MODULE AND HEAD LAMP INCLUDING THE SAME

CROSS REFERENCE TO RELATED APPLICATION

This application claims priority under 35 U.S.C. §119 to Korean Patent Application No. 10-2011-0081503, filed in Korea on Aug. 17, 2011 and No. 10-2011-0077096, filed in Korea on Aug. 2, 2011, which are hereby incorporated in its entirety by reference as if fully set forth herein.

TECHNICAL FIELD

Embodiments relate to a light emitting module and a head lamp including the same.

BACKGROUND

A Light Emitting Diode (LED) is a type of semiconductor element for converting electric energy into light. The LED has several advantages, such as low power consumption, semi-permanent lifespan, rapid response time, safety, and eco-friendliness, compared with an existing light source such as a fluorescent lamp, an incandescent lamp, or the like. Accordingly, various studies are underway in order to replace existing light sources with LEDs. The LED is an increasing trend towards being used as a light source of a lighting equipment such as a variety of lamps utilized in indoor and outdoor spaces, a liquid crystal display device, an electronic display board, a streetlamp, or the like.

Meanwhile, such an LED is applied to a head lamp for a vehicle, but there is a problem in that reliability is deteriorated due to exposure of a wire and light emitting device in the case of the conventional head lamp.

SUMMARY

Embodiments provide a light emitting module having improved reliability.

In one embodiment, a light emitting module includes a circuit board which has a cavity and includes a metal board, an insulation layer, and a circuit pattern, an insulation board disposed within the cavity, at least one light emitting device disposed on the insulation board, first and second pad disposed on the insulation board to be electrically connected with the light emitting device, and a conductive pad for electrically connecting the second pad and the circuit pattern.

In another embodiment, a light emitting module includes a circuit board which has a through hole and includes a metal board, an insulation layer, and a circuit pattern, an insulation board disposed so as to allow at least a portion thereof to spatially overlap with the through hole, at least one light emitting device disposed on the insulation board, first and second pads disposed on the insulation board to be electrically connected with the light emitting device, and a conductive pad for electrically connecting the second pad and the circuit pattern.

In a further embodiment, a head lamp includes a light emitting module to emit light, a reflector to reflect the light emitted from the light emitting module, and a lens to refract the light emitted from the light emitting module and the light reflected by the reflector, wherein the light emitting module includes a circuit board which has a cavity and includes a metal board, an insulation layer, and a circuit pattern, an insulation board disposed within the cavity, at least one light emitting device disposed on the insulation board, first and second pads disposed on the insulation board to be electrically connected with the light emitting device, and a conductive pad for electrically connecting the second pad and the circuit pattern.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
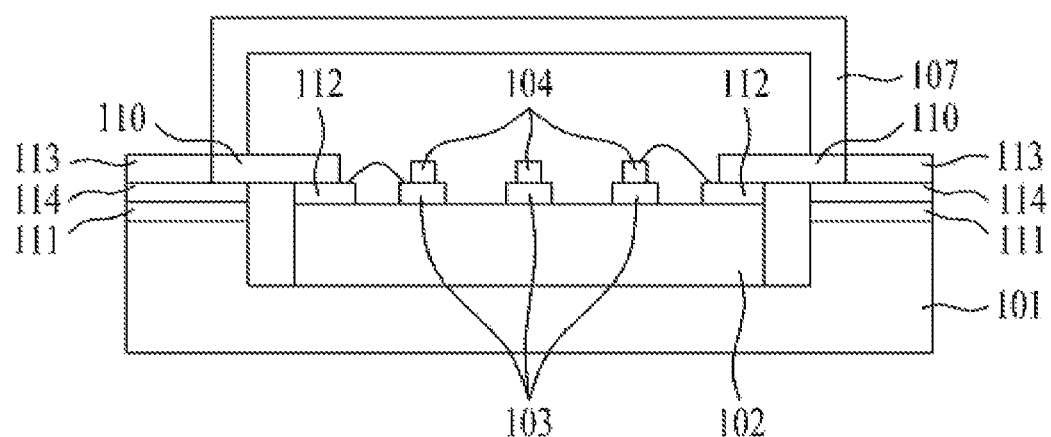
FIG. 1 is a lateral sectional view illustrating a light emitting module according to a first embodiment.

It will be understood that when a layer (film), region, pattern, or structure is referred to as being 'on' or 'under' another layer (film), region, pad, or pattern of a board, it can be directly on/under the layer (film), region, pad, or pattern, and one or more intervening layers may also be present. Also, the reference for 'on' or 'under' of each layer is described according to the drawings.

In the drawings, the thickness or size of each layer may be exaggerated, omitted or schematically illustrated for convenience and clarity of description. In addition, the size of each element does not wholly reflect an actual size thereof.

Hereinafter, a light emitting module according to embodiments will be described with reference to the annexed drawings.

FIG. 1 is a lateral sectional view illustrating a light emitting module according to a first embodiment.

In these embodiments or other embodiments, the light emitting device may be semiconductor light emitting device, for example, light emitting diode.

Referring to FIG. 1, the light emitting module according to the first embodiment includes a circuit board which has a cavity and includes a metal board 101, an insulation layer 111, and a circuit pattern 114, an insulation board 102 disposed within the cavity, at least one light emitting device 104 disposed on the insulation board 102, first and second pads 103 and 112 disposed on the insulation board 102 to be electrically connected with the light emitting device 104, and a conductive pad 110 for electrically connecting the second pad 112 and the circuit pattern 114.

The metal board 101 refers to a heat radiating plate having high thermal conductivity and may be made of an alloy which contains copper, aluminum, silver, gold, or the like. The cavity formed in the metal board 101 refers to a mounting portion for mounting a light emitting device package and may have a greater area than the light emitting device package.

A thickness of the metal board 101 may be at least 0.5 mm. The cavity of the metal board 101 has a depth of approximately 100~500 um and accounts for about 10~70% of a total area of the metal board 101.

The light emitting device package may include the insulation board 102, the first pad 103 on the insulation board 102, the light emitting device 104 which is electrically connected to the first pad 103 using a wire bonding manner or a conductive bonding manner, and the second pad 112 electrically connected to the first pad 103 or the light emitting device 104 using the wire or conductive bonding manner.

The insulation layer 111 may shut off a current flow between the metal board 101 and the circuit pattern 114, and may function as an adhesive layer for bonding the conductive pad 110, which is connected to the circuit pattern 114 and supplies current to the light emitting device 104. The insulation layer 111 may contain an epoxy or polyamide resin material, or be made of an oxide or nitride.

The circuit pattern 114 may be embedded in the insulation layer 111, and a solder resistor layer 113 may be disposed to expose the conductive pad 110.

The conductive pad 110 may be electrically connected to the second pad 112 so as to supply current to the light emitting device 104. For example, the conductive pad 110 may be disposed on the circuit pattern 114 on the insulation layer 111 and the second pad 112.

The conductive pad 110 may include a conductive layer made, for example, of an alloy which contains at least one of nickel (Ni), silver (Ag), gold (Au), copper (Cu), zinc (Zn), tin (Sn), lead (Pb), or palladium (Pd).

In accordance with the present embodiment, the conductive pad 110 may be disposed on the circuit pattern 114 on the insulation layer 111 and the second pad 112 using a eutectic or die bonding manner.

The insulation board 102 may be made of a nitride having high thermal conductivity and be disposed at the metal board 101, such that heat radiating characteristics of the light emitting module may be attained.

A thickness of the insulation board 102 may be in a range of 100 um to 1 mm.

The light emitting device 104 is disposed on the insulation board 102. The light emitting device 104 may include a light emitting structure which includes a first conductive type semiconductor layer, an active layer, and a second conductive type semiconductor layer, a first electrode on the first conductive type semiconductor layer, and a second electrode on the second conductive type semiconductor layer.

The light emitting device package may include a plurality of light emitting devices 104, and the plural light emitting devices 104 may be connected in series or parallel.

The light emitting device 104 or the first pad 103 may be electrically connected to the second pad 112 through a wire, and the conductive pad 110 may be electrically connected to the second pad 112 so as to supply current required to drive the light emitting device 104.

The circuit pattern 114 is disposed at the same height as the second pad 112, thereby being easily connected by the conductive pad 110.

The first and the second pad 103 and 112 may be formed as a thickness of 0.1~300 um, respectively. And the circuit pattern 114 may be formed as a thickness of 0.1~350 um.

The first pad 103 may include an electrode region at which the light emitting device 104 is attached and a connection region for wire bonding to a neighboring light emitting device 104 or the second pad 112.

A glass cover 107 may be placed on the circuit board, or, for example, on the conductive pad 110.

The glass cover 107 may transmit light generated from the light emitting device 104, and may protect the light emitting device 104 by having upper and side surfaces.

An anti-reflective coating may be applied to the glass cover 107, thereby allowing light generated from the light emitting device 104 to be efficiently transmitted without reflection.

The anti-reflective coating may be achieved by attaching an anti-reflective coating film to a glass base material or forming an anti-reflective coating layer by applying an anti-reflective coating liquid using a spin or spray coating manner.

The anti-reflective coating layer may contain at least one of $TiO_2$, $SiO_2$, $Al_2O_3$, $Ta_2O_3$, $ZrO_2$, or $MgF_2$.

The glass cover 107 may be placed so that a distance between the glass cover 107 and the light emitting device 104 is in a range of 0.2 to 40 mm.

A thickness of the glass cover 107 has no limit.

In accordance with the present embodiment, the glass cover 107 may have a hole in at least a portion of the surfaces thereof, thereby emitting gas due to heat generated from the light emitting device 104 or the circuit board.

Also, at least one of the side surfaces of the glass cover 107 may be formed to be opened, thereby emitting gas due to heat generated from the light emitting device 104 or the circuit board.

In accordance with the present embodiment, the glass cover 107 may have a dome shape.

In addition, the glass cover 107 may include a selective wavelength converting layer in at least one of the surfaces thereof.

In one example, the selective wavelength converting layer may be formed as a phosphor layer, and thus light of a first wavelength region generated from the light emitting device 104 may be converted into light of a second wavelength region.

When the phosphor layer is included at a portion of the surface of the glass cover 107, phosphor particles change a wavelength of light generated from the light emitting device 104, thereby outputting light of a particular wavelength band.

For example, when the light emitting device 104 generates blue light, the phosphor layer included in the glass cover 107 may contain yellow phosphors so as to allow output light to become white light.

In another example, the selective wavelength converting layer may be formed as a color filter, thereby transmitting only the light of a particular wavelength region among light of a predetermined wavelength region generated from the light emitting device 104.

The side surface of the glass cover 107 may include a slanted surface.

The slanted surface of the glass cover 107 may be tilted toward the circuit board at approximately 10~90 degrees.

When the side surface of the glass cover 107 includes the slanted surface, the slanted surface may comprise a reflective layer containing at least one of aluminum (Al), silver (Ag), platinum (Pt), rhodium (Rh), radium (Ra), palladium (Pd), or chromium (Cr) to reflect light generated from the light emitting device 104.

In this case, the reflective layer may include a metal layer which is made of a material having reflective properties, for example, aluminum (Al), silver (Ag), platinum (Pt), rhodium (Rh), radium (Ra), palladium (Pd), or chromium (Cr), or an alloy containing Al, Ag, Pt, or Rh.

The light emitting module according to the present embodiment electrically connects the light emitting device 104 and the circuit board through the conductive pad instead of the wire bonding manner, thereby enabling improvement in durability and reliability of the light emitting module.

Furthermore, the light emitting module according to the present embodiment may physically protect the light emitting device 104 included at the light emitting device package and the wire, in addition to the glass cover 107.

Since a light emitting module for a head lamp, for example, is very rapidly moved and exposed to heat, components including wires are physically subjected to damage with ease. The light emitting module according to the present embodiment, however, connects the circuit board and the light emitting device through the conductive pad, thereby having improved durability. As a result, it may be possible to prevent a problem generated due to cutting of the wire.

Also, the light emitting module according to the present embodiment includes the anti-reflective coating layer at the glass cover 107, and thus inner components of the light emitting module may be protected and light generated from the light emitting device 104 may be efficiently transmitted.

Figure 2A:
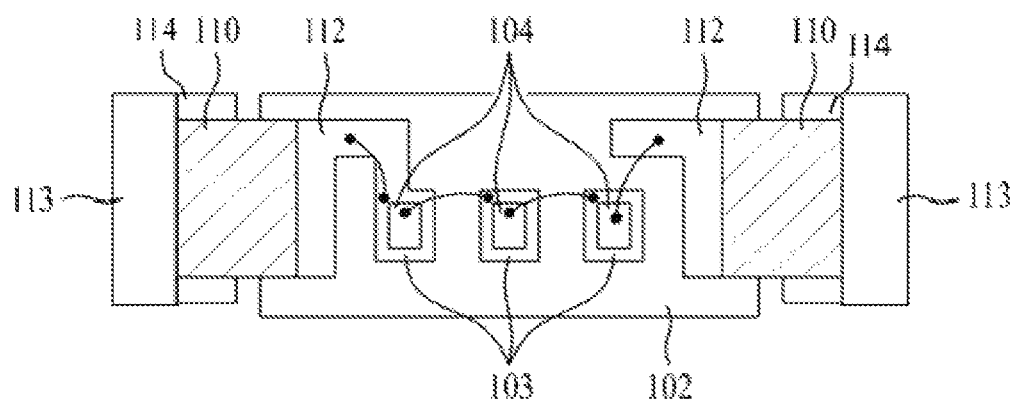
FIGS. 2A to 2C are top views illustrating various connection configurations of light emitting devices included in the light emitting module according to the illustrated embodiments.
Figure 2B:
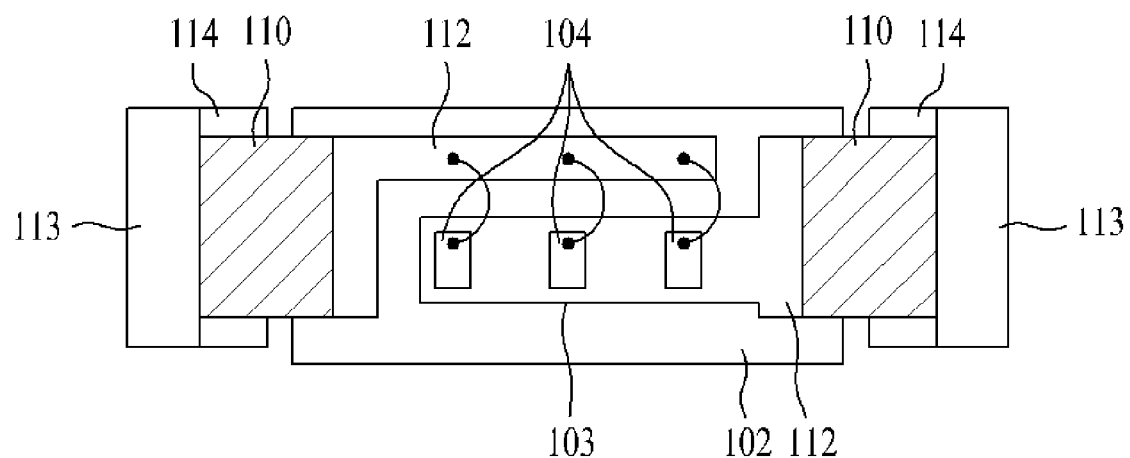
Figure 2C:
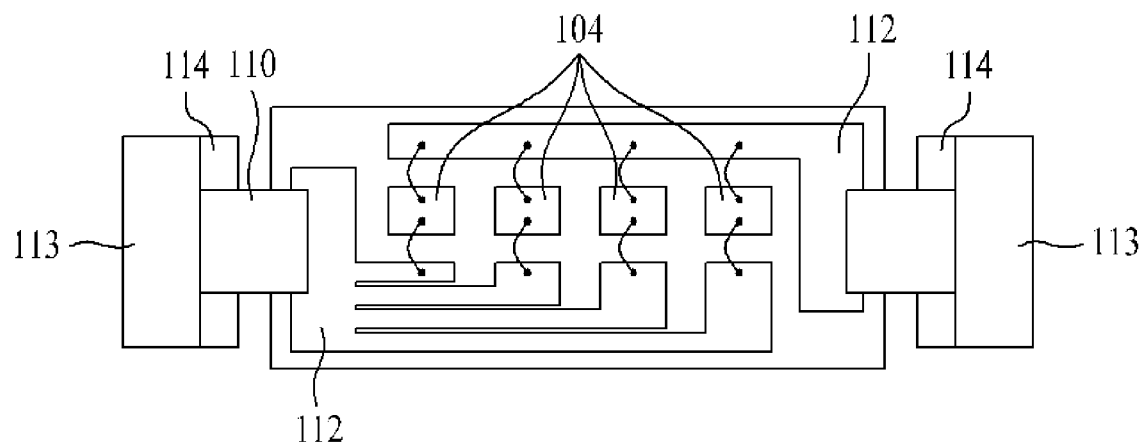

FIGS. 2A to 2C are top views illustrating various connection configurations of the light emitting devices included in the light emitting module according to the illustrated embodiments.

Referring to FIGS. 2A to 2C, in a plurality of light emitting devices 104, one light emitting device 104 may be electrically connected to a neighboring light emitting device 104 or the second pad 112 using the wire bonding manner.

In accordance with the present embodiment, each light emitting device 104 may be a vertical type light emitting device or a horizontal type light emitting device 104, but is not limited thereto.

The light emitting device 104 may be connected to the neighboring light emitting device 104 or the second pad 112 in series or parallel.

Figure 3:
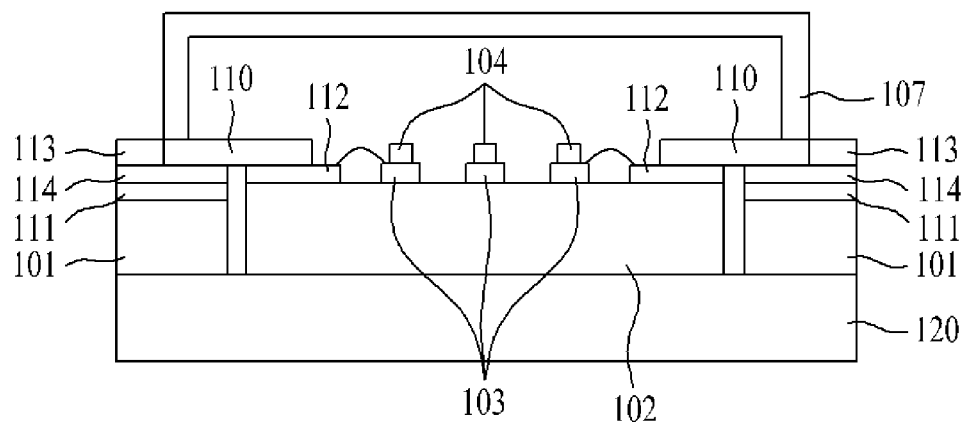
FIG. 3 is a lateral sectional view illustrating a light emitting module according to a second embodiment.

FIG. 3 is a lateral sectional view illustrating a light emitting module according to a second embodiment.

Referring to FIG. 3, the light emitting module according to the second embodiment includes a circuit board which has a through hole and includes a metal board 101, an insulation layer 111, and a circuit pattern 114, an insulation board 102 disposed so as to allow at least a portion thereof to spatially overlap with the through hole, at least one light emitting device 104 disposed on the insulation board 102, first and second pads 103 and 112 disposed on the insulation board 102 to be electrically connected with the light emitting device 104, and a conductive pad 110 for electrically connecting the second pad 112 and the circuit pattern 114.

Hereinafter, configurations different from the above-mentioned embodiment will be described and no description with respect to configurations similar to the above-mentioned embodiment will be given.

A heat radiating member 120 may be disposed beneath the insulation board 102.

The insulation board 102 is disposed at a region on the heat radiating member 120, which corresponds to the through hole formed at the circuit board without being disposed on the circuit board, thereby reducing a heat transfer distance required to outwardly radiate heat generated from the light emitting device 104. As a result, heat radiating characteristics of the light emitting module may be improved.

The insulation board 102 may be disposed within the through hole, and be disposed so as to allow an entire portion of a portion thereof to spatially overlap with the through hole.

The heat radiating member 120 may be made of a metal material, such as aluminum, zinc, copper, steel, or stainless steel, or an alloy thereof, and may serve to support the light emitting device package and the circuit board.

Although not shown, a thermally conductive member may be disposed between the insulation board 102 and the heat radiating member 120.

The thermally conductive member allows heat to be efficiently transferred from the insulation board 102 to the heat radiating member 120 by tight contact between the insulation board 102 and the heat radiating member 120. As a result, heat radiating characteristics of the light emitting module may be improved.

Figure 4:
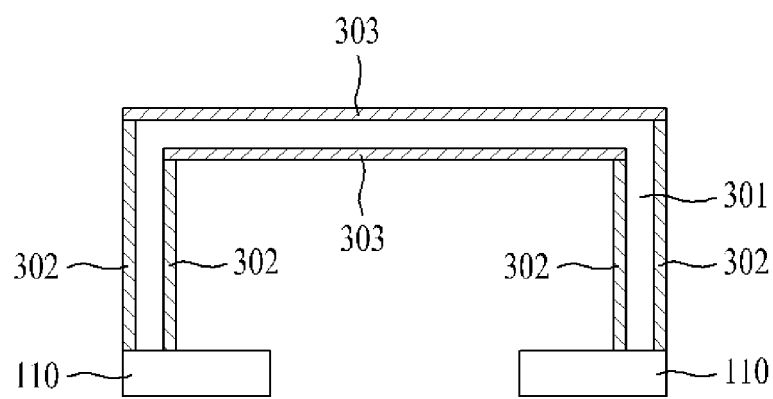
FIG. 4 is a view illustrating a glass cover according to an exemplary embodiment, which is arranged at the light emitting module according to the above-mentioned embodiments.

FIG. 4 is a view illustrating a glass cover according to an exemplary embodiment, which is arranged at the light emitting module according to the above-mentioned embodiments.

A glass cover 107 may be placed on the circuit board of the light emitting module, or, for example, on the conductive pad 110.

Referring to FIG. 4, the glass cover 107 may include, at an upper surface thereof, an anti-reflective coating layer 303 in which an anti-reflective coating is applied to a glass material 301. The anti-reflective coating layer 303 may be formed by attaching an anti-reflective coating film to the glass material 301 or applying an anti-reflective coating liquid using a spin or spray coating manner.

Accordingly, the light emitting module according to the present embodiment enables light reflected by the glass cover 107 to be minimized, thereby efficiently transmitting light emitted from the light emitting device 104.

At least one of the surfaces of the glass cover 107 may include a reflective layer 302 to reflect light generated from the light emitting device 104, and the reflective layer 302 may contain at least one of aluminum (Al), silver (Ag), platinum (Pt), rhodium (Rh), radium (Ra), palladium (Pd), or chromium (Cr).

The reflective layer 302 may include a metal layer which is made of a material having reflective properties, for example, aluminum (Al), silver (Ag), platinum (Pt), rhodium (Rh), radium (Ra), palladium (Pd), or chromium (Cr), or an alloy containing Al, Ag, Pt, or Rh.

The reflective layer 302 allows light generated from the light emitting device 104 to be reflected and pass through the glass cover 107, thereby enabling light efficiency of the light emitting module. In addition, the glass cover 107 may include a slanted surface at a side surface thereof to increase light reflective efficiency, and the reflective layer 302 may also be formed on the slanted surface.

Furthermore, the glass cover 107 may include a selective wavelength converting layer in at least a portion of the surface thereof.

In one example, the selective wavelength converting layer may be formed as a phosphor layer, and thus light of a first wavelength region generated from the light emitting device 104 may be converted into light of a second wavelength region.

When the phosphor layer is included at a portion of the surface of the glass cover 107, phosphor particles change a wavelength of light generated from the light emitting device 104, thereby outputting light of a particular wavelength band.

In another example, the selective wavelength converting layer may be formed as a color filter, thereby transmitting only the light of a particular wavelength region among light of a predetermined wavelength region generated from the light emitting device 104.

Figure 5:
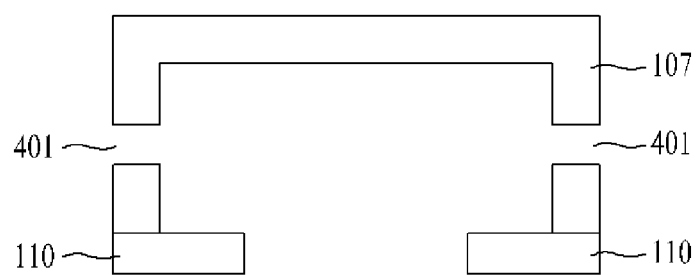
FIG. 5 is a view illustrating a glass cover according to another exemplary embodiment.
Figure 5:
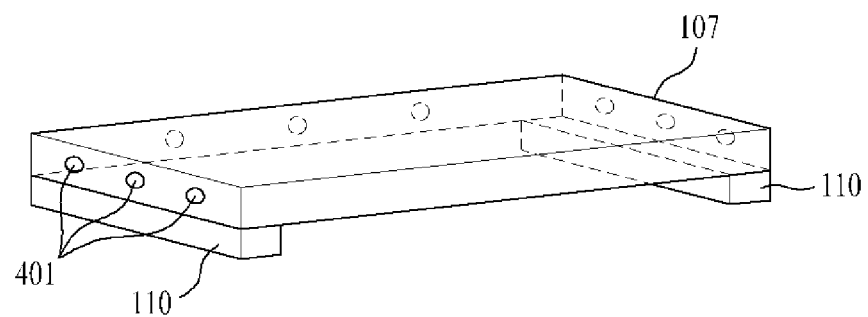

FIG. 5 is a view illustrating a glass cover according to another exemplary embodiment.

Referring to FIG. 5, a glass cover 107 may have at least one hole 401 in at least a portion of the surfaces thereof, thereby outwardly emitting gas due to heat generated from the light emitting device 104 or the circuit board.

Figure 6:
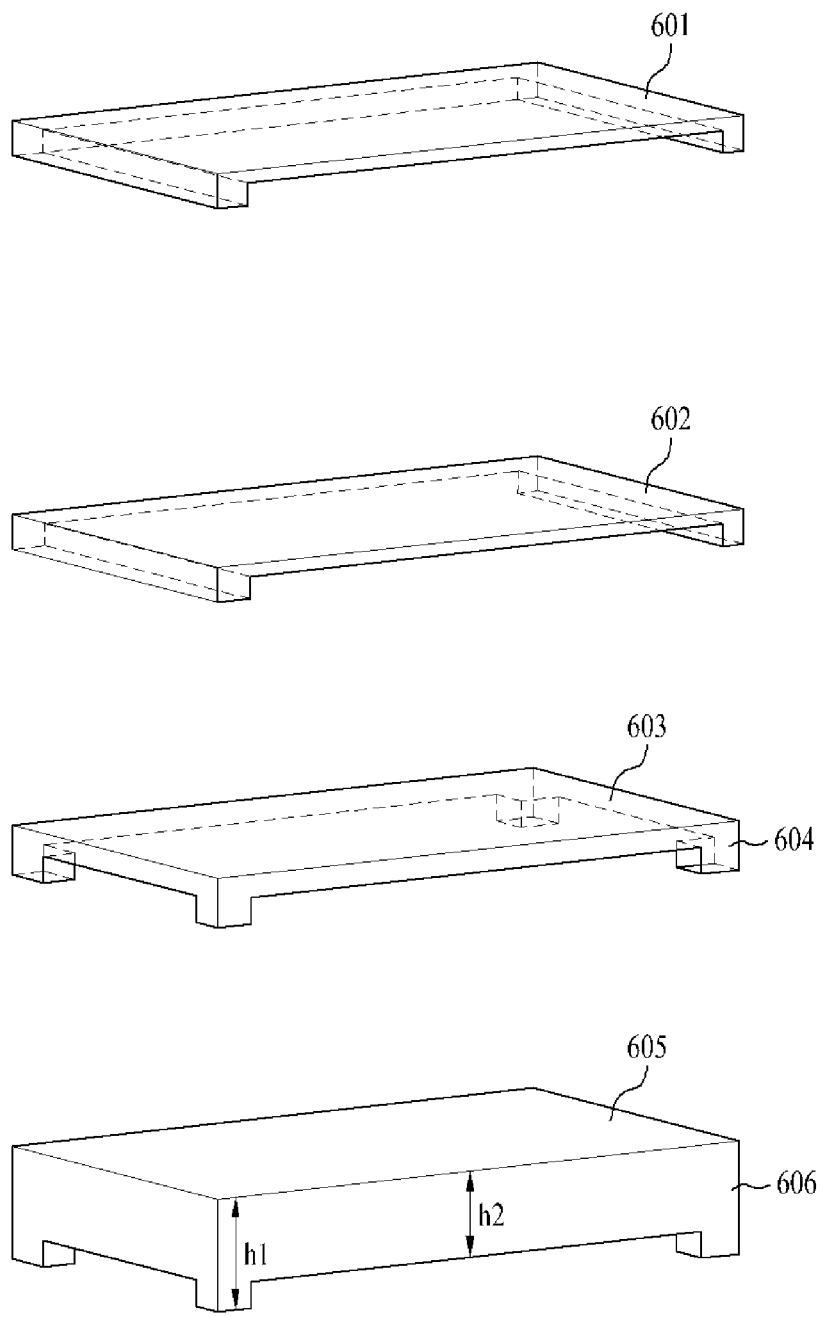
FIG. 6 is a view illustrating glass covers according to still another exemplary embodiment.

FIG. 6 is a view illustrating glass covers according to still another exemplary embodiment.

Referring to FIG. 6, at least one of side surfaces of each of glass covers 601 and 602 may be formed to be opened, thereby emitting gas due to heat generated from the light emitting device 104 or the circuit board.

In addition, according to the present embodiment, a glass cover 603 may also include support members 604 having a pillar shape at a side surface thereof.

Furthermore, a glass cover 605 may be formed, at a side surface thereof, by a combination of faces having two or more heights different from one another. For example, the side surface of the glass cover 605 is formed by the combination of the faces having the heights h1 and h2 different from each other, such that a portion of the side surface of the glass cover 605 is formed to be opened. Consequently, it may be possible to emit gas due to heat generated from the light emitting device 104 or the circuit board FIG. 7 is a lateral sectional view illustrating a light emitting module according to a third embodiment.

Hereinafter, configurations different from the above-mentioned embodiment will be described and no description with respect to configurations similar to the above-mentioned embodiment will be given.

Figure 7:
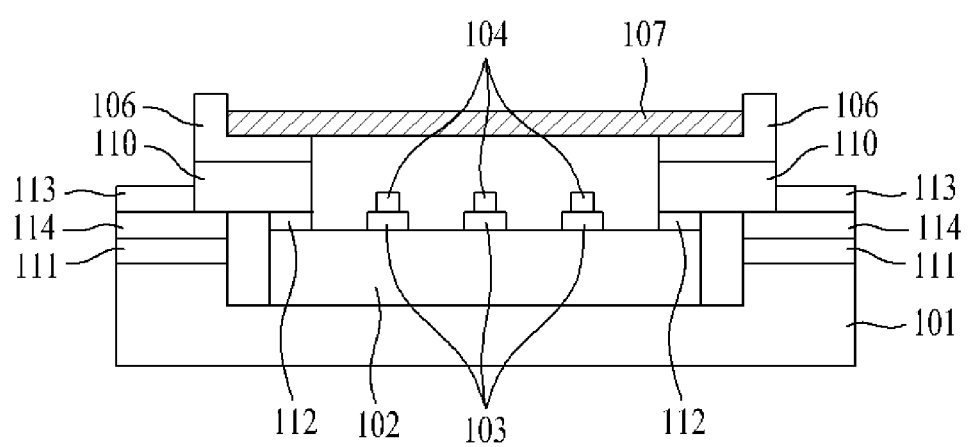
FIG. 7 is a lateral sectional view illustrating a light emitting module according to a third embodiment.

Referring to FIG. 7, the light emitting module according to the third embodiment may further include a support member 106 disposed between a circuit board and a glass cover 107.

For example, in the light emitting module, the support member 106 may be disposed on the conductive pad 110, and the glass cover 107 may be disposed on the support member 106 to be supported.

Figure 8:
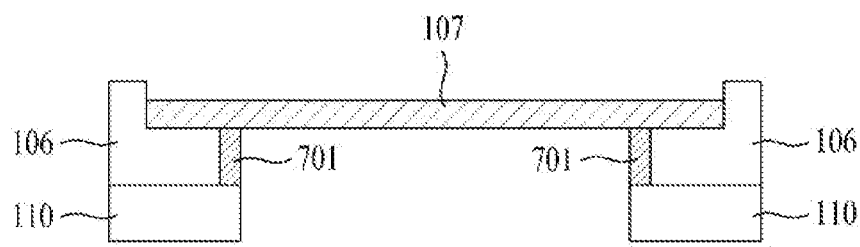
FIG. 8 is a view illustrating a reflective layer formed at one surface of a support member according to an exemplary embodiment.

FIG. 8 is a view illustrating a reflective layer formed at one surface of a support member according to an exemplary embodiment.

Referring to FIG. 8, a reflective layer 701 may be formed at one surface of the support member 106. The reflective layer 701 may contain at least one of aluminum (Al), silver (Ag), platinum (Pt), rhodium (Rh), radium (Ra), palladium (Pd), and chromium (Cr).

The reflective layer 701 allows light generated from the light emitting device 104 to be reflected and pass through the glass cover 107, thereby enabling light efficiency of the light emitting module.

Figure 9:
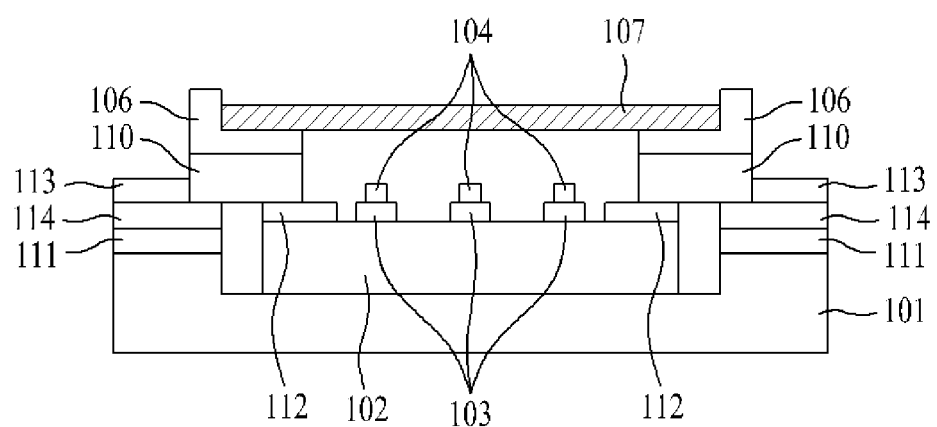
FIG. 9 is a lateral sectional view illustrating a light emitting module according to a fourth embodiment.

FIG. 9 is a lateral sectional view illustrating a light emitting module according to a fourth embodiment.

Hereinafter, configurations different from the above-mentioned embodiment will be described and no description with respect to configurations similar to the above-mentioned embodiment will be given.

Referring to FIG. 9, the light emitting module according to the fourth embodiment may further include a support member 106 disposed between a circuit board and a glass cover 107. An insulation board 102 may be disposed within a through hole formed at the circuit board.

For example, in the light emitting module, the support member 106 may be disposed on the conductive pad 110, and the glass cover 107 may be disposed on the support member 106 to be supported.

A heat radiating member 120 may be disposed beneath the insulation board 102, thereby enabling improvement in heat radiating characteristics of the light emitting module.

Figure 10:
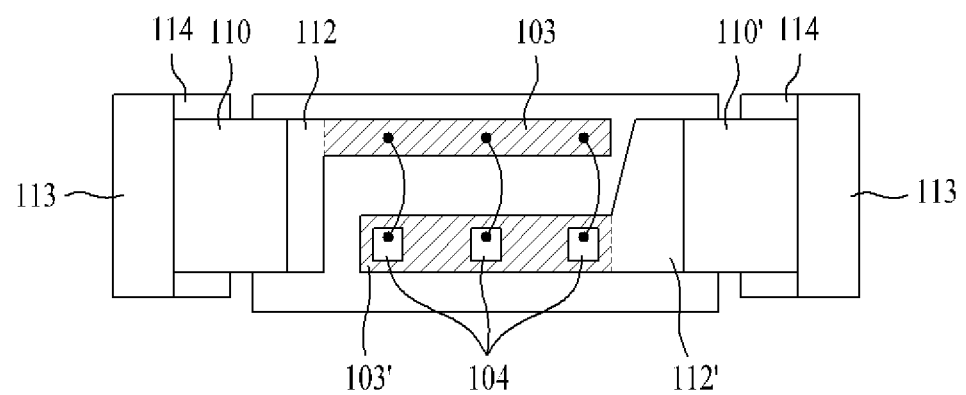
FIG. 10 is a top view illustrating a light emitting module according to a fifth embodiment.

FIG. 10 is a top view illustrating a light emitting module according to a fifth embodiment.

Hereinafter, configurations different from the above-mentioned embodiment will be described and no description with respect to configurations similar to the above-mentioned embodiment will be given.

Referring to FIG. 10, a pad of the light emitting module according to the fifth embodiment includes first and second regions 103 and 103' which are electrically connected with a light emitting device 104 using a wire bonding or conductive bonding manner.

A first electrode portion 112 may disposed at one side of the first region 103 and a second electrode portion 112' may disposed at one side of the second region 103'. The first and second electrode portions 112 and 112' may be electrically connected to a circuit board through a conductive pad 110.

Figure 11:
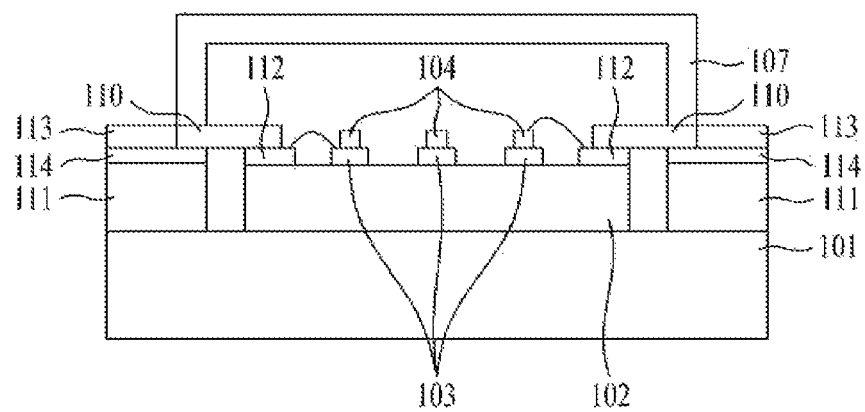
FIG. 11 is a lateral sectional view illustrating a light emitting module according to a sixth embodiment.

FIG. 11 is a lateral sectional view illustrating a light emitting module according to a sixth embodiment.

Hereinafter, configurations different from the above-mentioned embodiment will be described and no description with respect to configurations similar to the above-mentioned embodiment will be given.

Referring to FIG. 11, a pad the light emitting module according to the sixth embodiment includes a circuit board which includes a metal board 101, an insulation layer 111, and a circuit pattern 114, an insulation board 102 disposed on the metal board 101, at least one first pad 103 on the insulation board 102, at least one light emitting device 104 electrically connected with the first pad 103, a second pad 112 which is disposed on the insulation board 102 and is electrically connected with the light emitting device 104 or the first pad 103 using a wire or conductive bonding manner, and a conductive pad 110 for electrically connecting the second pad 112 and the circuit board.

The metal board 101 does not have a cavity, and the insulation board 102 and the light emitting device 104 are disposed on the metal board 101.

A glass cover 107 may be disposed on the circuit board, or, for example, on the conductive pad 110.

Figure 12:
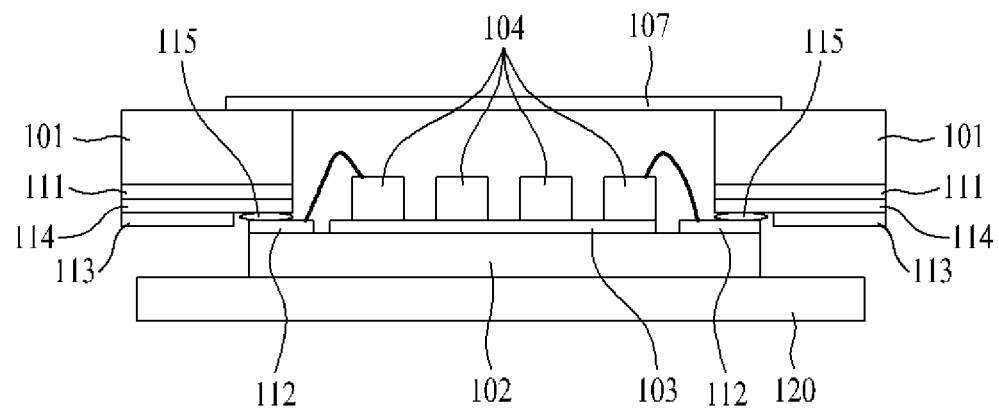
FIG. 12 is a lateral sectional view illustrating a light emitting module according to a seventh embodiment.

FIG. 12 is a lateral sectional view illustrating a light emitting module according to a seventh embodiment.

The light emitting module according to the seventh embodiment includes at least one light emitting device 104, an insulation board 102 including first and second pads 103 and 112 which are electrically connected with the light emitting device 104, and a circuit board which includes a metal board 101, an insulation layer 111, and a circuit pattern 114 and has a through hole for insertion of the light emitting device 104.

The circuit board may be arranged so that the through hole is disposed on the insulation board 102.

Unlike the above-mentioned embodiments, the circuit board is arranged in a state in which the top and bottom thereof is reversed so that the metal board 101 is disposed above the circuit pattern 114, in the seventh embodiment.

The circuit pattern 114 may be electrically connected to the second pad 112 by a conductive connection member, namely, a conductive adhesive 115, so as to supply current required to drive the light emitting device 104.

A heat radiating member 120 may be disposed beneath the insulation board 102.

A glass cover 107 may be disposed over the metal board 101, and be disposed to cover the through hole, thereby transmitting light generated from the light emitting device 104.

FIGS. 13 to 16 are views illustrating a method for manufacturing a light emitting module according to an exemplary embodiment. FIGS. 13 to 16 show a manufacturing process of the light emitting module according to the second embodiment as one example.

Figure 13:
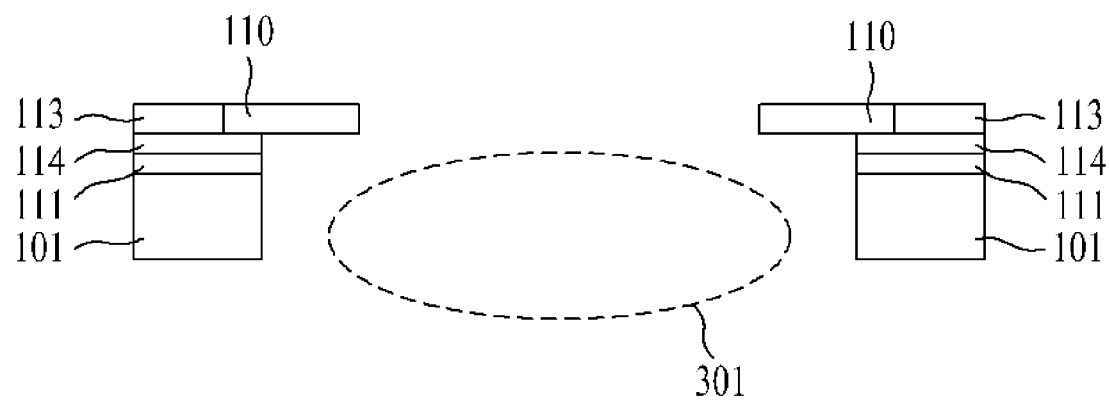
FIGS. 13 to 16 are views illustrating a method for manufacturing a light emitting module according to an exemplary embodiment.

Referring to FIG. 13, the circuit board having the hole 301 is first arranged. The circuit board may include the metal board 101, the insulation layer 111, and the circuit pattern 114.

The metal board 101 refers to the heat radiating plate having high thermal conductivity and may be made of an alloy which contains copper, aluminum, silver, or gold. The hole formed at the metal board 101 refers to a space for inserting the light emitting device package and may have a greater area than the light emitting device package.

The circuit pattern 114 may be embedded in the insulation layer 111, and the solder resistor layer 113 may be formed to expose the conductive pad 110 on the circuit pattern 114.

Figure 14:

Subsequently, referring to FIG. 14, the conductive adhesive 115 may be applied to a portion of the surface of the conductive pad 110, and the conductive adhesive 115 may be used to bond the light emitting device package afterward.

The conductive adhesive 115 may be made, for example, of a material selected from the group containing gold (Au), tin (Sn), indium (In), silver (Ag), nickel (Ni), niobium (Nb), or copper (Cu), or an alloy thereof.

Figure 15:
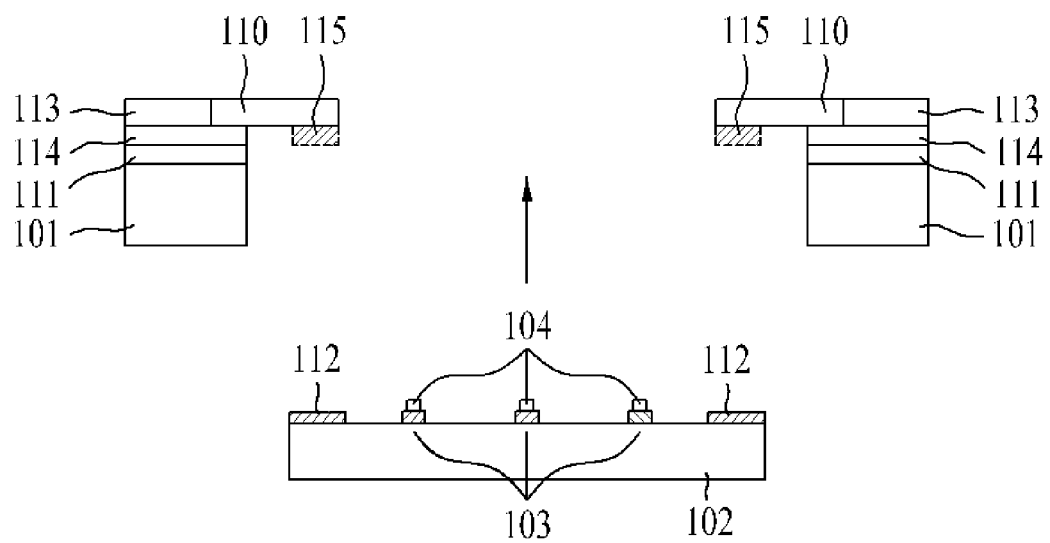

As shown in FIG. 15, the insulation board 102, at which the light emitting device 104 is arranged, is inserted into the through hole 301 of the circuit board, thereby bonding the conductive adhesive 115 and the second pad 112. Consequently, the second pad 112 is electrically connected to the conductive pad 110.

Figure 16:
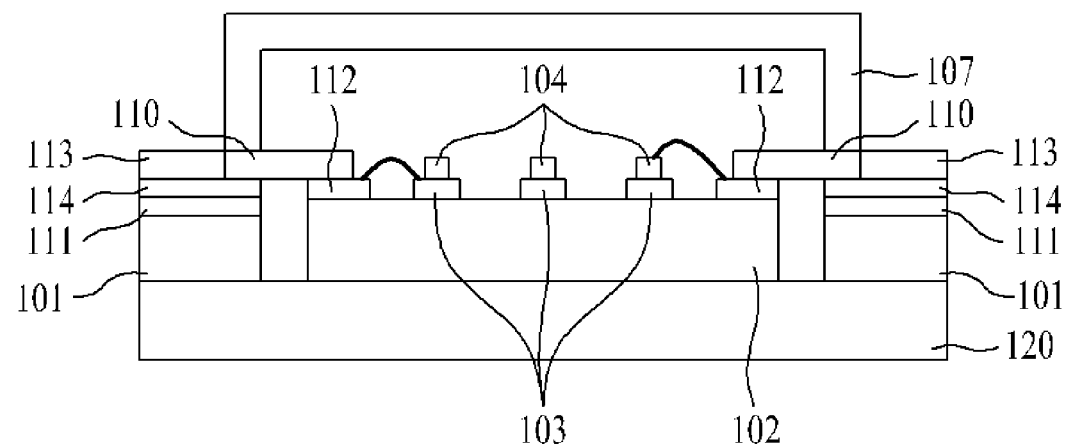

Thereinafter, as shown in FIG. 16, the heat radiating member 120 is disposed beneath the insulation board 102, and the glass cover 107 is disposed over the circuit board.

Figure 17:
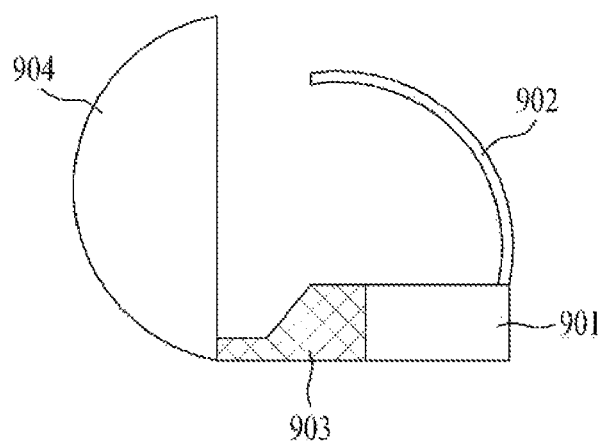
FIG. 17 is a view illustrating a head lamp according to an exemplary embodiment, in which the light emitting module according to the above-mentioned embodiments is included.

FIG. 17 is a view illustrating a head lamp according to an exemplary embodiment, in which the light emitting module according to the above-mentioned embodiments is included.

Referring to FIG. 17, light, which passes through a glass cover of a light emitting module 901 according to the above-mentioned embodiments, is reflected by a reflector 902 and a shade 903 and then passes through a lens 904, so as to be directed forward of a vehicle body.

The lens 904 serves to refract light emitted from the light emitting module 901 and light reflected by the reflector 902.

As described above, the light emitting module 901 according to the above-mentioned embodiments electrically connects the light emitting device 104 and the circuit board through the conductive pad instead of the wire bonding manner, thereby enabling improvement in durability and reliability of the light emitting module.

Also, light emitting module 901 may serve to physically protect the wire and the light emitting device included in the light emitting device package, in addition to the glass cover 107.

Furthermore, the glass cover 107 includes the anti-reflective coating layer, and protects inner components of the light emitting module, thereby transmitting light generated from the light emitting device 104.

The light emitting device package included in the light emitting module may mount a plurality of light emitting devices 104, but is not limited thereto.

A plurality of light emitting device packages, each of which has the above-mentioned configuration according to the illustrated embodiment, is prepared, and is then arrayed on a board. Optical members, namely, light guide plates, prism sheets, diffusion sheets, etc., may be arranged on optical paths of the light emitting device packages. Such light emitting device packages, board, and optical members may function as a light unit. In accordance with another embodiment, a display device, an indication device or a lighting system may be implemented using the semiconductor light emitting devices or light emitting device packages described in conjunction with the above-mentioned embodiments. The lighting system may include, for example, a lamp or a street lamp.

As is apparent from the above description, a light emitting device is electrically connected to a circuit board through a conductive pad instead of a wire bonding manner, thereby enabling improvement in durability and reliability of a light emitting module.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module comprising:
a circuit board which has a cavity and comprises a metal board, an insulation layer, and a circuit pattern;
an insulation board disposed in the cavity;
at least one light emitting device disposed on the insulation board;
first and second pads disposed on the insulation board and electrically connected with the light emitting device, wherein the first pad is spaced apart from the second pad; and
a conductive pad electrically connecting the second pad and the circuit pattern,
wherein the conductive pad is disposed on the second pad and the circuit pattern, and a lower surface of the conductive pad directly contacts with upper surfaces of the second pad and the circuit pattern, and
wherein a thickness of the conductive pad is greater than a thickness of the circuit pattern and a thickness of the second pad.

2. The light emitting module according to claim 1, wherein the second pad is spaced apart from the at least one light emitting device, and the light emitting device is electrically connected to the first or second pad using at least one of wire bonding or conductive bonding.

3. The light emitting module according to claim 1, further comprising a glass cover which is disposed on the circuit board.

4. The light emitting module according to claim 3, further comprising a support member disposed between the circuit board and the glass cover,
wherein the support member is disposed around the insulation board.

5. The light emitting module according to claim 4, wherein the support member comprises at least one of aluminum (Al), silver (Ag), platinum (Pt), rhodium (Rh), radium (Ra), palladium (Pd), or chromium (Cr).

6. The light emitting module according to claim 3, wherein the glass cover has an upper surface and side surfaces and at least one hole in at least one of the surfaces thereof.

7. The light emitting module according to claim 3, wherein the glass cover comprises an anti-reflective coating layer in at least one of the surfaces thereof.

8. The light emitting module according to claim 3, wherein the side surface of the glass cover is formed by a combination of faces having two or more heights different from one another.

9. The light emitting module according to claim 3, wherein the glass cover comprises a wavelength converting layer in at least a portion of the surfaces thereof.

10. The light emitting module according to claim 1, wherein the circuit pattern is disposed at the same height as the second pad.

11. The light emitting module according to claim 3, wherein the side surface of the glass cover comprises a slanted surface, and the slanted surface comprises a reflective layer containing at least one of aluminum (Al), silver (Ag), platinum (Pt), rhodium (Rh), radium (Ra), or palladium (Pd) to reflect light generated from the light emitting device.

12. The light emitting module according to claim 1, wherein the light emitting device comprises a light emitting structure which includes a first conductive type semiconductor layer, an active layer, and a second conductive type semiconductor layer, a first electrode on the first conductive type semiconductor layer, and a second electrode on the second conductive type semiconductor layer.

13. The light emitting module according to claim 4, wherein the support member is disposed on the conductive pad, and a lower surface of the support member contacts with an upper surface of the conductive pad.

14. The light emitting module according to claim 4, further comprising a reflective layer disposed on one surface of the support member under the glass cover.

15. The light emitting module according to claim 1, wherein one portion of the lower surface of the conductive pad contacts with the upper surface of the second pad, and another portion of the lower surface of the conductive pad contacts with the upper surface of the circuit pattern.

16. The light emitting module according to claim 1, wherein at least one light emitting device is attached on the first pad.

17. A head lamp comprising:
a light emitting module to emit light;
a reflector to reflect the light emitted from the light emitting module; and
a lens to refract the light emitted from the light emitting module and the light reflected by the reflector,
wherein the light emitting module comprises:
a circuit board which has a cavity and comprises a metal board, an insulation layer, and a circuit pattern;
an insulation board disposed in the cavity;
at least one light emitting device disposed on the insulation board;
first and second pads disposed on the insulation board to be and electrically connected with the light emitting device; and
a conductive pad electrically connecting the second pad and the circuit pattern, wherein the conductive pad is disposed on the second pad and the circuit pattern, and a lower surface of the conductive pad contacts with upper surfaces of the second pad and the circuit pattern, and
wherein a thickness of the conductive pad is greater than a thickness of the circuit pattern and a thickness of the second pad.

* * * * *